(12) United States Patent
Arias et al.

(10) Patent No.: US 7,459,400 B2
(45) Date of Patent: Dec. 2, 2008

(54) PATTERNED STRUCTURES FABRICATED BY PRINTING MASK OVER LIFT-OFF PATTERN

(75) Inventors: Ana C. Arias, San Carlos, CA (US); Rene A. Lujan, Sunnyvale, CA (US); William S. Wong, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 354 days.

(21) Appl. No.: 11/184,304

(22) Filed: Jul. 18, 2005

(65) Prior Publication Data

US 2007/0020883 A1 Jan. 25, 2007

(51) Int. Cl.
*H01L 21/311* (2006.01)
(52) U.S. Cl. .................................... 438/695; 438/149
(58) Field of Classification Search ................. 438/311, 438/313, 695
See application file for complete search history.

(56) References Cited

U.S. PATENT DOCUMENTS

| | | | | |
|---|---|---|---|---|
| 5,521,032 A * | 5/1996 | Imai et al. | ....................... | 430/5 |
| 6,127,725 A * | 10/2000 | Harris | ....................... | 257/686 |
| 6,348,295 B1 * | 2/2002 | Griffith et al. | ............... | 430/198 |
| 6,742,884 B2 | 6/2004 | Wong et al. | | |
| 6,818,959 B2 * | 11/2004 | Montelius et al. | .......... | 257/415 |
| 6,872,320 B2 | 3/2005 | Wong et al. | | |
| 6,890,050 B2 | 5/2005 | Ready et al. | | |
| 6,913,944 B2 * | 7/2005 | Hirai | ............................ | 438/99 |
| 6,972,261 B2 * | 12/2005 | Wong et al. | ................. | 438/706 |
| 7,109,118 B2 * | 9/2006 | Cohen et al. | ................ | 438/697 |
| 2003/0134516 A1 * | 7/2003 | Wong et al. | .................. | 438/695 |
| 2005/0032362 A1 * | 2/2005 | Cohen et al. | ................ | 438/658 |
| 2005/0136358 A1 * | 6/2005 | Paul et al. | .................... | 430/311 |
| 2005/0142293 A1 * | 6/2005 | Ready et al. | ................ | 427/258 |
| 2005/0158880 A1 * | 7/2005 | Ostuni et al. | .................... | 438/1 |
| 2006/0003475 A1 * | 1/2006 | Adewole et al. | .............. | 438/22 |
| 2006/0057851 A1 * | 3/2006 | Wong et al. | ................. | 438/694 |
| 2006/0105492 A1 * | 5/2006 | Veres et al. | ................... | 438/99 |
| 2006/0131266 A1 * | 6/2006 | Street et al. | .................... | 216/41 |

(Continued)

OTHER PUBLICATIONS

Thomasson D.B., "Fully Self-Aligned Tri-layer a-Si:H Thin-Film Transistors with Deposited Doped Contact Layer" IEEE Electron Device Letters, vol. 19, No. 4 1998 p. 124-126.*

*Primary Examiner*—N Drew Richards
*Assistant Examiner*—Grant S Withers
(74) *Attorney, Agent, or Firm*—Bever, Hoffman & Harms, LLP; Patrick T. Bever

(57) ABSTRACT

A patterned integrated circuit structure defining a gap or via is fabricated solely by digital printing and bulk processing. A sacrificial lift-off pattern is printed or otherwise formed over a substrate, and then covered by a blanket layer. A mask is then formed, e.g., by printing a wax pattern that covers a region of the blanket layer corresponding to the desired patterned structure, and overlaps the lift-off pattern. Exposed portions of the blanket layer are then removed, e.g., by wet etching. The printed mask and the lift-off pattern are then removed using a lift-off process that also removes any remaining portions of the blanket layer formed over the lift-off pattern. A thin-film transistor includes patterned source/drain structures that are self-aligned to an underlying gate structure by forming a photoresist lift-off pattern that is exposed and developed by a back-exposure process using the gate structure as a mask.

17 Claims, 10 Drawing Sheets

U.S. PATENT DOCUMENTS

2006/0131563 A1* 6/2006 Salleo et al. .................. 257/40
2007/0026585 A1* 2/2007 Wong et al. .................. 438/151
2007/0082438 A1* 4/2007 Li et al. ...................... 438/206
2007/0145362 A1* 6/2007 Wolkin et al. ................. 257/43
2007/0161163 A1* 7/2007 Hirai .......................... 438/149
2007/0166874 A1* 7/2007 Lin et al. ..................... 438/102

* cited by examiner

## PATTERNED STRUCTURES FABRICATED BY PRINTING MASK OVER LIFT-OFF PATTERN This invention was made with Government support under 70NANBOH3033 awarded by NIST/ATP. The Government has certain rights in this invention.

BACKGROUND OF THE INVENTION

1. Field of the Invention

The invention relates generally to electronic materials processing, and more particularly to a system and method for fabricating patterned structures without using photolithography.

2. Related Art

Large area electronic devices (e.g., modern video and computer LCD (liquid crystal display) devices) typically include large arrays of thin-film transistors (TFTs) for addressing individual elements of the electronic device (e.g., pixels of the displays). As the demand for larger electronic devices, such as LCD displays, continues to rise, the TFT arrays used in these devices must include increasing numbers of TFTs and more complex interconnect structures. In addition, the need for large display devices complicates the fabrication of these devices using conventional semiconductor processes. In combination, these factors result in ever-increasing TFT array size and complexity.

To reduce some of the costs associated with the production of these larger LCD displays, a lift-off process is sometimes used to generate patterned structures that device openings (vias) and gaps between the various structures that make up the TFT array. In a conventional lift-off process, a base layer on which a patterned photoresist layer is formed is blanket-coated with an overlying thin film, typically a metal layer. Then, the patterned photoresist layer is stripped, which removes those portions of the metal layer formed on top of the patterned photoresist layer, leaving a patterned metal layer on the base layer. By eliminating the need for a separate etch process to create the patterned metal layer, the conventional (photoresist-based) lift-off process can simplify the overall production process, thereby reducing production costs. However, patterning the photoresist layer still requires a photolithography process. For cost-reduction purposes, it is generally desirable to minimize the number of photolithography process steps required. This is not only due to the demanding nature of the photolithography process itself, but also due to the time and costs involved in producing the delicate photomasks used in the photolithography process.

Accordingly, what is needed is a method for forming patterned structures for large area electronic devices that does not require the need for photolithographic masks. In particular, what is needed is an efficient method for defining vias and gaps in these patterned structures with a high degree of accuracy and reliability.

SUMMARY OF THE INVENTION

The invention is directed towards methods for forming large area integrated circuit (electronic) devices made up of patterned layer structures that are formed using digital printing systems, a lift-off process, and bulk processing techniques, thereby eliminating the need for complex and expensive photolithograph processing.

According to an embodiment of the invention, a patterned structure having two portions separated by a void (e.g., a metal structure defining a via, or source/drain structures of a TFT separated by a gap) is fabricated by forming a sacrificial lift-off pattern, forming a blanket (e.g., metal) layer over the lift-off pattern, printing a mask over a region of the blanket layer corresponding to the two portions of the patterned structure, and the removing exposed portions of the blanket layer, the printed mask, and the lift-off pattern, thereby forming the patterned structure from the two remaining portions of the blanket layer, which are separated by a gap defined by the now-removed lift-off pattern. In one specific embodiment, the lift-off pattern is directly printed by a digital printing system onto a substrate, such as a semiconductor layer, glass, or plastic, or a base layer, such as a dielectric layer formed on a substrate. In another embodiment, the lift-off pattern is formed indirectly, e.g., using photoresist that is exposed/developed using a previously formed structure (e.g., a gate structure) as a mask. The blanket layer (such as gold, chromium, or aluminum) is then deposited over the substrate/base layer and the lift-off pattern. According to an embodiment of the invention, an oxygen plasma clean is performed prior to the blanket deposition to improve adherence of the blanket layer to the substrate/base layer. The printed mask is then formed using the digital printing system, for example, by printing a wax pattern that overlaps the lift-off pattern, and masks predetermined regions of the blanket layer located on opposite sides of or around the lift-off pattern. Exposed portions of the blanket layer are then removed, for example, by way of a wet etch process, whereby the patterned structure is substantially formed by the remaining layer regions covered by the printed mask. Next, the printed mask and the lift-off pattern are removed, along with any remaining portions of the blanket layer that may overly the lift-off layer, thereby completing the patterned structure. This patterned structure can be used as an actual device structure (e.g., source/drain or interconnect structures), or as a mask for processing of underlying layers.

The fabrication of the present invention provides several benefits over conventional large area electronics fabrication methods. First, because the fabrication process of the present invention is non-contact (referred to as digital printing below) and the patterned structure is produced using only digital printing techniques and bulk processing (i.e., layer deposition and surface etching), particle defects, in comparison to a contact mask, can be lower. In addition, because the patterned structures are formed by digital printing processes, the large area integrated circuit devices can be formed on non-planar surfaces, unlike photolithography, which requires a very flat surface to maintain pattern fidelity. Further, printed lift-off patterns simplify the alignment of that lift-off pattern with underlying elements, since photomask handling is eliminated completely. This is particularly beneficial when creating low coverage lift-off patterns (i.e., lift-off patterns that only affect a small portion of the overall patterned area, such as via masks), since the photomasks required for such low coverage patterns are mostly opaque, and are therefore difficult to align with underlying elements. Moreover, because the area covered by printed structures (e.g., the lift-off pattern and the printed mask) is essentially the same size as the resulting patterned structure, the present method minimizes the amount of digital printing needed to produce large area integrated circuit devices, thereby further reducing production costs.

In accordance with another embodiment, the present invention provides a method for fabricating TFTs that utilizes back-side exposure to self-align the lift-off pattern to the gate structure, which further reduces the overlap between source/drain and gate of a TFT. The TFT fabrication process begins by forming a gate structure, which can be formed directly on a substrate or one or more underlying layers, provided the underlying layers are light transparent. A dielectric layer utilized by the TFT is then formed over the gate structure. Photoresist is deposited on the dielectric layer. The lift-off pattern utilized to define a self-aligned channel of the TFT is then formed by processing (developing) the photoresist using backside exposure, whereby the gate structure acts as a mask to shade a portion of the photoresist located directly over the gate structure. The exposed regions of the photoresist are then removed, leaving a photoresist lift-off pattern that is substantially self-aligned to the corresponding side edges of the underlying gate structure. Source/drain structures are then formed by depositing a source/drain metal layer over the lift-off pattern and exposed portions of the dielectric layer. Next, a source/drain mask is printed over on the source/drain metal to define the source/drain structures, and exposed portions of the source/drain metal layer are then etched. The source/drain mask is then removed and a lift-off process is the performed to remove the lift-off pattern, thereby exposing the desired channel between the spaced apart source and drain structures. The TFT can then be completed by the deposition of a semiconducting material over the channel region. As an example the semiconducting material could be an organic semiconductor deposited from solution or by sputtering.

In accordance with yet another embodiment, the present invention provides a method for fabricating TFTs that utilize an amorphous silicon (a-Si:H)-based bottom gate structure. The TFT fabrication process begins by forming a gate structure (e.g., chromium), then forming a three-layer stack including an a-Si:H layer sandwiched between two dielectric layers (e.g., $Si_3N_4$) over the gate structure. A transparent sacrificial layer (e.g., indium-tin oxide (ITO)) is then formed on the stack and an island mask is printed on the sacrificial layer in a region overlapping the gate structure. Exposed portions of both the sacrificial layer and the upper dielectric layer are then etched away. The island mask is then removed. A blanket photoresist layer is then formed, and the gate structure is used as a mask to shade a portion of the photoresist located directly over the gate structure. The exposed regions of the photoresist are then removed, leaving a photoresist pattern on the remaining sacrificial layer portion that is substantially self-aligned to the corresponding side edges of the underlying gate structure. The photoresist pattern is then used to etch the remaining sacrificial layer and top dielectric portion, thus forming a lift-off pattern that is also substantially self-aligned to the corresponding side edges of the underlying gate structure. Source/drain structures are then formed by depositing a doped (N+) Si layer followed by a source/drain metal layer over the lift-off pattern and exposed portions of the semiconductor structure. Next, a source/drain mask is printed over on the source/drain metal to define the source/drain structures, and exposed portions of the source/drain metal layer are then etched. The source/drain mask is then removed and a lift-off process is then performed to remove the lift-off pattern, thereby exposing the desired channel between the spaced apart source and drain structures. TFTs produced in accordance with this embodiment were found to exhibit operating characteristics that were comparable to TFTs produced by standard fabrication methods. Accordingly, the present embodiment provides a method that enables the production of high quality TFTs for large area electronic devices without requiring the use of lithographic masks.

BRIEF DESCRIPTION OF THE DRAWINGS

These and other features, aspects and advantages of the present invention will become better understood with regard to the following description, appended claims, and accompanying drawings, where:

DETAILED DESCRIPTION

Printing of integrated circuit (IC) patterns is an emerging technology that attempts to reduce the costs associated with IC production by printing an IC pattern directly on a substrate rather than creating the pattern using the delicate and time-consuming photolithography processes used in conventional IC manufacturing. As described in co-owned, co-pending U.S. patent application Ser. No. 10/224,701 (METHOD FOR PRINTING OF HOMOGENOUS ELECTRONIC MATERIAL WITH A MULTI-EJECTOR PRINT HEAD") [XC-030]), which is incorporated herein by reference in its entirety, the printed IC pattern typically comprises actual IC features (i.e., elements that will be incorporated into the final IC, such as the gates and source and drain regions of thin film transistors, signal lines, opto-electronic device components, etc.) or a mask for subsequent semiconductor processing (e.g., etch, implant, etc.). As described in co-owned, co-pending U.S. patent application Ser. No. 10/741,252 ("PATTERNING USING WAX PRINTING AND LIFT OFF" [XC-038]), which is incorporated herein by reference in its entirety, pattern printing is used to create a lift-off pattern for use in a lift-off process, thereby providing an alternative to the costly and sensitive photolithography operations used in conventional lift-off processes. U.S. Pat. Nos. 6,872,320 and 6,742, 884, also incorporated herein by reference in their entirety, teach using temperature control to vary printed feature size with multi-layer registration.

As described in the embodiments set forth below, the present invention utilizes the pattern printing and lift-off pattern processes of the above-mentioned applications, in combination with standard bulk-processing techniques (e.g., blanket layer formation and wet etching, to generate patterned integrated circuit (IC) structures on a substrate. In one specific embodiment set forth below, the methods of the present invention are utilized to define vias (openings) through patterned structures using a minimum number of etching steps and printing time, thereby facilitating efficient connections between patterned structures of different layers that form an electronic device. In other embodiments, the methods of the present invention are utilized to fabricate patterned IC structures using pattern printing, bulk processing and lift-off processing that exhibit smaller gaps between features with less overlap between layers. In other embodiments, the methods of the present invention are utilized to fabricate associated patterned structures formed in two layers (e.g., the gate electrode and source/drain electrodes of a thin-film transistor (TFT)) that minimize or eliminate overlap between the associated patterned structures.

Figure 1:
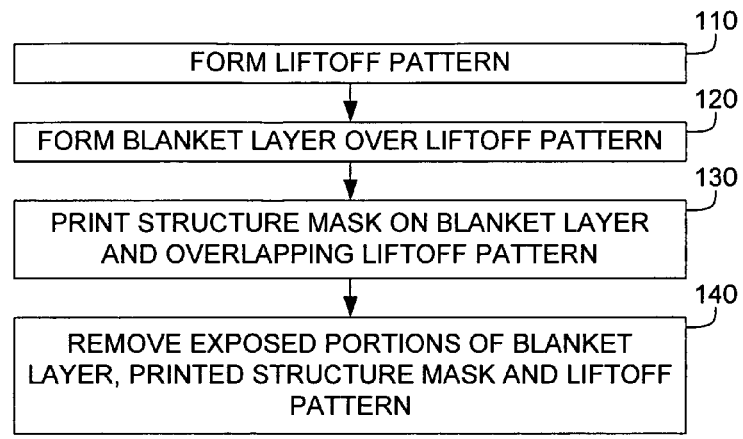
FIG. 1 is a flow diagram showing a generalized method for fabricating patterned structures on a substrate according to a generalized embodiment of the present invention.

FIG. 1 is a flow diagram depicting a generalized method according to the present invention for fabricating patterned structures on a substrate such that the patterned structure includes first and second portions that are separated by a void (e.g., a gap or a via (opening)). FIGS. 2(A) to 2(E) are cross-sectional side views depicting the method of FIG. 1 in accordance with an exemplary embodiment of the invention.

The method begins by forming a lift-off pattern in the shape of the desired void over the substrate (block 110). The lift-off pattern is a sacrificial material that occupies the space ultimately defined by the desired void, and therefore the lift-off pattern is positioned in a predetermined area over, for example, a feature that was previously formed on the substrate. For example, as depicted in FIG. 2, a substrate 201 includes a previously formed patterned structure 205, and a base or intermediate layer 207 (e.g., a blanket dielectric layer) formed over feature 205. Lift-off pattern 210 is the formed on over feature 205, for example, by wax printing using printing system 300 described below with reference to FIG. 3 utilizing the methods described in co-owned U.S. application Ser. No. 10/741,252 [XCP-038], cited above. In alternative embodiments also described below, lift-off pattern 210 may be formed using a resist layer developed using back-side exposure. In yet other embodiments, lift-off pattern 210 is deposited using, for example, jet printing, screen printing, gravure, off-set printing, and xerography.

Figure 2A:
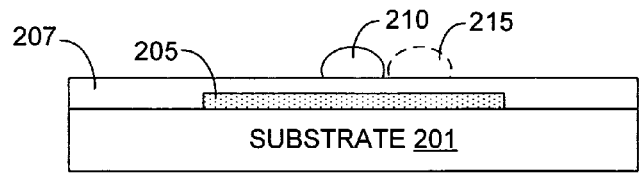
FIGS. 2(A), 2(B), 2(C), 2(D) and 2(E) are cross-sectional side views depicting stages of a patterned structure fabrication process in accordance with an embodiment of the invention.
Figure 3:
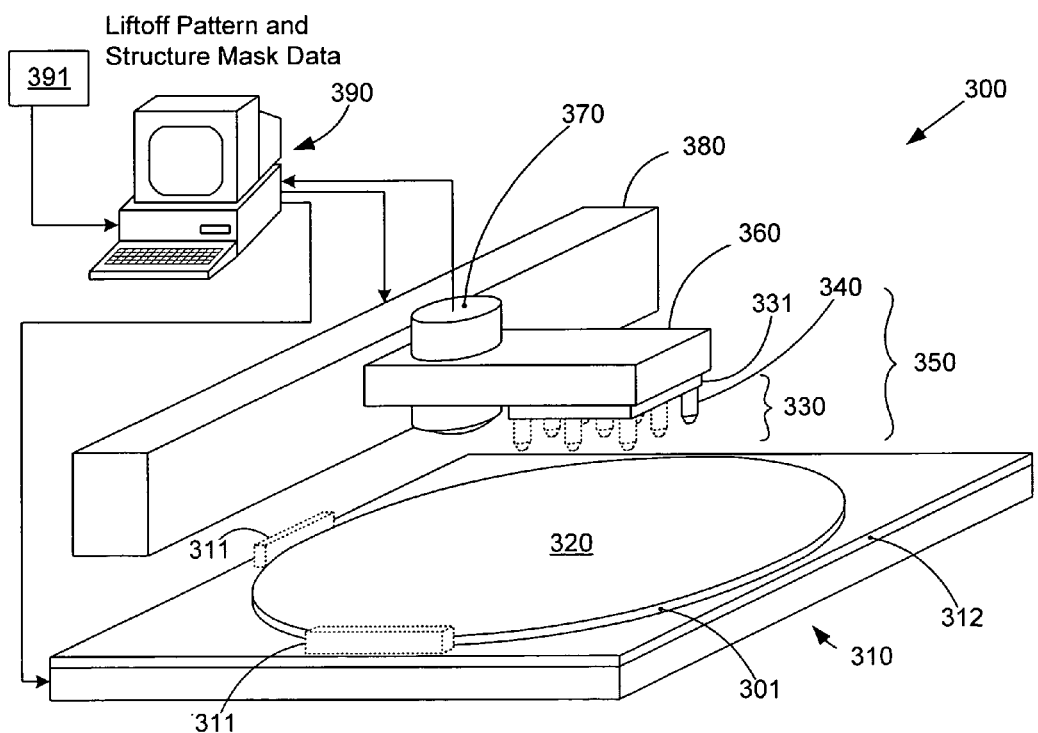
FIG. 3 is a perspective view of a pattern printing system in accordance with an embodiment of the invention.

FIG. 3 is a perspective view of a printing system 300 for printing masks and lift-off patterns (e.g., printed element 210 in FIG. 2(A)) in accordance with an embodiment of the invention. Printing system 300 includes a stage 310 for supporting (and optionally translating) a workpiece 301 (e.g., a substrate or wafer), a print assembly 350 mounted to a printing support structure 380, and a computer/workstation 390 that serves as both a system controller and data processor. Stage 310 includes a rotational platform 312 that allows the orientation of workpiece 301 to be adjusted. Optional alignment features 311 on rotational platform 312 can be included to provide gross positioning and capture of workpiece 301.

Print assembly 350 includes a print head 330 (on a rotational fixture) and a camera 370 (having high magnification capabilities) mounted in a rigid mount 360. Print head 330 includes one or more ejectors 340 mounted in an ejector base 331. Ejectors 340 are configured to dispense droplets of the appropriate printing fluid on a base layer 320 of workpiece 301.

Computer/workstation 390 is configured to receive lift-off pattern and mask data from a data source 391, and then provide appropriate control signals to printing support structure 380 and stage 310. Data source 391 can comprise any source of lift-off pattern data, including a networked computer, a lift-off pattern database connected via a local area network (LAN) or wide area network (WAN), or even a CD-ROM or other removable storage media. The control signals provided by computer/workstation 390 control the motion and printing action of print head 330 as it is translated relative to the base layer 320.

Note that the printing action can be provided by printing support structure 380, by stage 310, or by both in combination. Note further that the printing action does not have to involve actual movement of the print head itself, as print head 330 could be held stationary while stage 310 translates base layer 320. Computer/workstation 390 is also coupled to receive and process imaging data from camera 370. In one embodiment, camera 370 provides both manual and automated calibration capabilities for printing system 300.

By properly calibrating and registering printing system 300 with respect to base layer 320, the lift-off pattern (e.g., lift-off pattern 210, FIG. 2(A)) printed by printing system 300 can be precisely aligned with existing elements in workpiece 301 (e.g., feature 205, FIG. 2(A)), thereby ensuring a high-yield manufacturing process. According to an embodiment of the invention, system calibration can be accomplished with a video camera microscope (such as camera 370) having an optical axis position that is fixed relative to the ejector positions of the print head. Other details and aspects associated with system calibration are described in co-owned U.S. application Ser. No. 10/741,252 [XCP-038].

Referring again to FIG. 2(A), note that while base layer 207 is depicted as a layer on a substrate 201 for exemplary purposes, according to another embodiment of the invention, lift-off pattern 210 may be formed directly onto a surface of substrate 201. Note further that while base layer 207 is depicted as a single layer for clarity, according to various other embodiments of the invention, base layer 207 could comprise any number of layers. Similarly, while substrate 201 is depicted as a single layer for clarity, according to various other embodiments of the invention, substrate 201 can comprise any number of layers and can include any type of device or structure within those layers.

The following discussion will assume lift-off pattern 210 is printed using printing system 300, described above. Depending on the type and intended use, the printing fluid used to form printed lift-off pattern 210 can comprise a variety of materials, including phase-change materials (e.g., wax, photoresist, and epoxies) and colloidal suspensions (e.g., solution-processable electronic (i.e., conducting, semiconducting, or dielectric materials). Meanwhile, base layer 207 can comprise any material on which the lift-off pattern can be printed, such as a semiconductor material, a glass plate, or even flexible materials such as fabric or plastics.

Printed lift-off pattern 210 is formed when an ejector of print head 330 (FIG. 3) ejects printing fluid onto base layer 207. The printing fluid attaches itself to base layer 207 through a wetting action and proceeds to solidify in place in a rounded cross-sectional profile. The specific size and shape of this profile is guided by competing processes of solidification and wetting. In the case of printing phase-change materials, solidification occurs when the printed drop loses its thermal energy to the substrate and reverts to a solid form. In another case, colloidal suspensions such as organic polymers and suspensions of electronic material in a solvent or carrier are printed and wet to the substrate leaving a printed feature. The thermal conditions and material properties of the printing fluid and substrate, along with the ambient atmospheric conditions, determine the specific rate at which the deposited printing fluid transforms from a liquid to a solid.

Note that according to an embodiment of the invention, closely spaced printed elements can be used to create lift-off pattern features that are much smaller than the minimum printed element dimensions. For example, a second printed element 215 (indicated by the dotted line) could be printed next to printed lift-off pattern 210. Printed elements 230 and 231 have a minimum width, but may be spaced (edge to edge) by a distance that is smaller than the element width.

In one alternative embodiment, an optional surface treatment (not shown) is performed on base layer 207 after forming lift-off pattern 210. The surface treatment (such as a clean operation) improves the bonding between base layer 207 and a subsequently deposited blanket layer (described in greater detail below with respect to FIG. 2(B)), thereby improving the conditions for the eventual lift-off operation. According to an embodiment of the invention, the surface treatment can comprise exposing base layer 207 to a plasma etching step (e.g., an oxygen plasma) at room temperature for, e.g., 30 to 120 seconds.

Figure 2B:
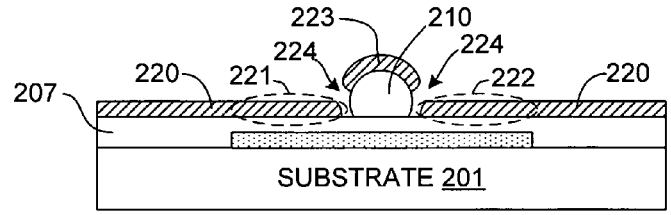

Referring again to FIG. 1, a blanket layer is formed over the substrate and the lift-off pattern (block 120). As depicted in FIG. 2(B), blanket 220 is blanket-deposited over base layer 207 and lift-off pattern 210 such that a first portion 221 of blanket layer 220 is formed on base layer 207 and located on a first side of lift-off pattern 210, a second portion 222 formed on base layer 207 and located on a second (opposite) side of lift-off pattern 210, and a third portion 223 formed on lift-off pattern 210. Because of the steep side edges and/or rounded profile of printed lift-off pattern 210, blanket layer 220 includes attack points 224 around lift-off pattern 210. Attack points 224 are relatively thin compared to horizontal sections of blanket layer 240 (e.g., sections formed on base layer 207), and therefore allow a solvent to penetrate lift-off layer 220 and attack lift-off layer 210 during a subsequent strip operation. Note that blanket layer 220 itself can comprise any material that is not significantly affected by the solvent used to strip lift-off pattern 210. For example, if lift-off pattern 210 comprises a wax element, blanket layer 220 could comprise a metal layer (e.g., gold, chromium, or aluminum), an oxide layer, or a semiconductor layer, among others.

Note further that the degree of thinning at attack points 224 depends to a large degree on the profile of lift-off pattern 210. The greater the thinning, the more effectively the strip operation can attack lift-off pattern 210, and the more reliably the lift-off operation can be performed. According to an embodiment of the invention, the printing operation parameters (e.g., printing material, printing speed) can be adjusted such that the printed lift-off pattern element profile causes actual gaps to be formed in blanket layer 220, as depicted in FIG. 2(B).

Figure 2C:
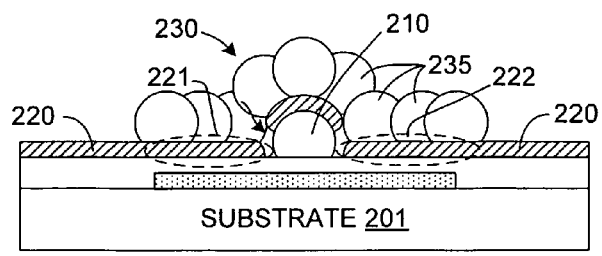

Referring back to FIG. 1, a mask is printed onto the blanket layer that overlaps the lift-off pattern and masks the portion of the blanket layer used to form the desired patterned structure (block 230). As depicted in FIG. 2(C) structure mask 230 is formed by multiple printed elements 235 that are printed by printing system 300 as described above, and form a substantially unbroken cover over first and second portions 221 and 222, and over lift-off pattern 210.

Finally, referring to the bottom of FIG. 1, exposed portions of the blanket layer are then removed, along with the printed structure mask and the lift-off pattern (block 140). In one embodiment, as depicted in FIGS. 2(D) and 2(E), the removal process is performed by wet etching the exposed portions of the blanket layer, followed by a wax removal and/or a lift-off process to remove printed structure mask 230 and lift-off pattern 210.

Figure 2D:
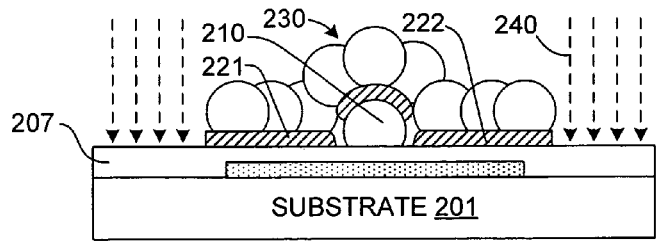

Referring to FIG. 2(D), wet etching is performed by applying a suitable etchant 240 to exposed portions of the blanket layer, leaving only portions of the blanket layer that are protected, for example, by printed structure mask 230 (e.g., first portion 221 and second portion 222). For example, if printed mask 230 comprises wax and the blanket layer comprises of a Chromium layer, then nitric acid could be used as etchant 240 during the wet etching process.

Figure 2E:
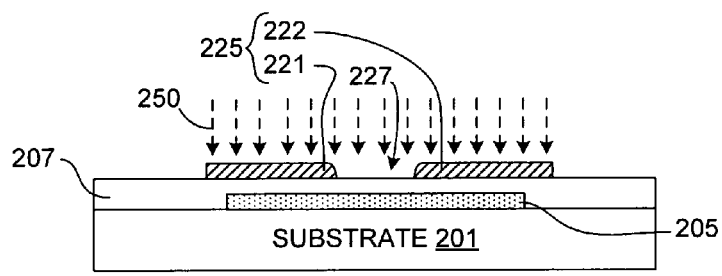

Next, referring to FIG. 2(E), the printed structure mask and lift-off pattern are removed, for example, using a solvent 250. For example, if printed mask 230 and lift-off pattern 210 comprise wax, and the blanket layer comprises metal, then tetrahydrofuran or toluene could be used as a solvent during the mask removal/lift-off process. Sonication and/or heating may be used to speed up the mask removal/lift-off process. Once the lift-off process is complete, what remains is patterned structure 225, which includes the retained first portion 221 and second portion 222 separated by void 227, as shown in FIG. 2(E). First and second portions 221 and 222 of patterned structure 225 therefore have an outer peripheral edge that is substantially the same the printed structure mask, but void 225 has an outer edge that is the inverse of the shape formed by lift-off pattern 210. According to an embodiment of the invention, patterned structure 225 can comprise actual device structures (e.g., contact pads for an IC, electrodes for a transistor device or any other structure in substrate 201, or bus lines). According to another embodiment of the invention, patterned structure 225 can comprise a mask for further processing of base layer 207. In yet another embodiment of the invention, patterned structure 225 can serve both as a mask for further processing of base layer 207, and as an actual device structure.

Figure 4A:
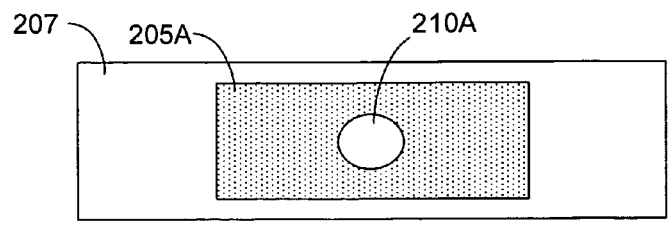
FIGS. 4(A), 4(B), 4(C), 4(D) and 4(E) are plan views depicting stages of a via formation-type patterned structure fabrication process in accordance with another embodiment of the invention.
Figure 4B:
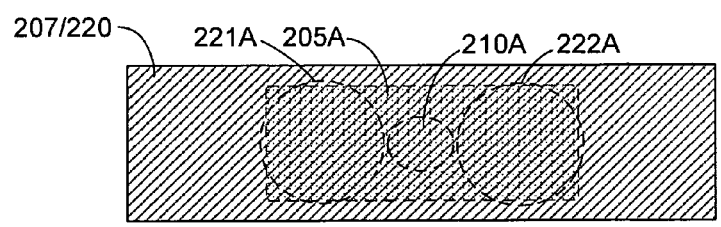
Figure 4C:
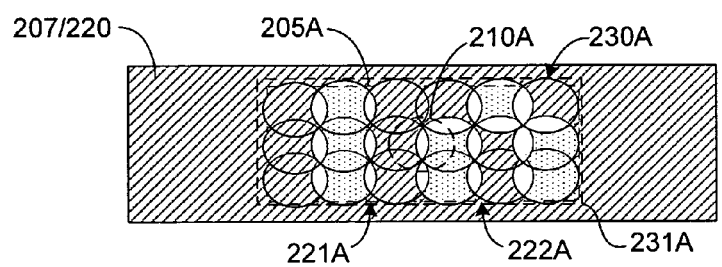
Figure 4D:
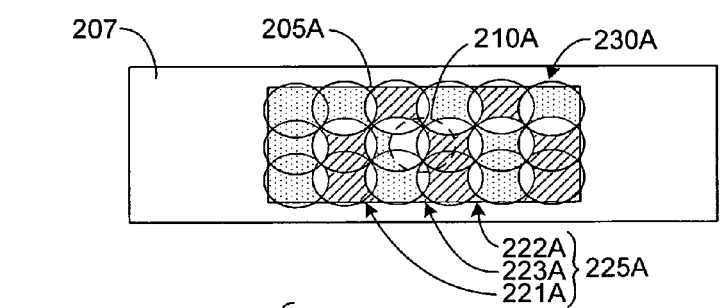
Figure 4E:
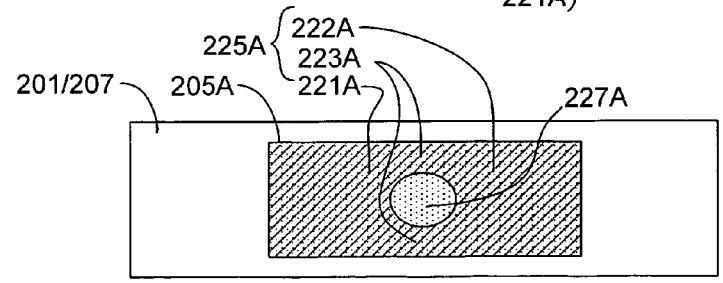

FIGS. 4(A) to 4(E) are top plan views showing the formation of a patterned structure 225A (shown in FIG. 4(E)) that defines a via (opening) 227A according to a specific embodiment of the present invention. Such vias can be used, for example, to electrically connect the patterned structure to an underlying structure. FIGS. 4(A) to 4(E) generally correspond to the processes described above with reference to FIGS. 2A) to 2(E), respectively, and structures of 4(A) to 4(E) are identified with reference numbers that are similar to corresponding structures of FIGS. 2A) to 2(E).

FIG. 4(A) shows a substantially dot-like (i.e., substantially one-dimensional) lift-off pattern 210A that is formed on base layer 207 over feature 205A. Next, as indicated in FIG. 4(B), blanket layer 220 is formed over base layer 207, and includes portions 221A and 222A formed over corresponding regions of feature 205A and are generally located on opposite sides of lift-off pattern 210A. FIG. 4(C) shows a printed structure mask 230A, which is then printed on blanket layer 220 such that printed structure mask 230A overlaps (covers) lift-off pattern 210A and is generally aligned with the outer edge of feature 205A (i.e., such that an outer peripheral edge 231A (indicated by dashed line) of mask 230A completely surrounds lift-off pattern 210A). Note that the pattern of mask 230A is arbitrarily selected for illustrative purposes, and actual mask patterns need not correspond to an underlying feature. FIG. 4(D) shows the structure after wet etching has removed exposed portions of the blanket layer surrounding printed mask 230A, thereby forming a rectangular, island-like patterned structure 225A including portions 221A and 222A, which are located on opposite sides of lift-off pattern 210A and are linked by portions 223A that extend around lift-off pattern 210A between portions 221A and 222A. FIG. 4(E) shows patterned structure 225A after mask 230A and lift-off pattern 210A are removed, thereby exposing a via 227A, which is located between first and second portions 221A and 222A, and occupies the space previously occupied by the dot-like lift-off pattern. Note that via 227A is positioned over feature 205A such that via 227A can be used, for example, to form a metal via connection structure between patterned structure 225A and feature 205A in accordance with processes described in co-owned U.S. application Ser. No. 10/741,252 [XCP-038], cited above.

Figure 5A:
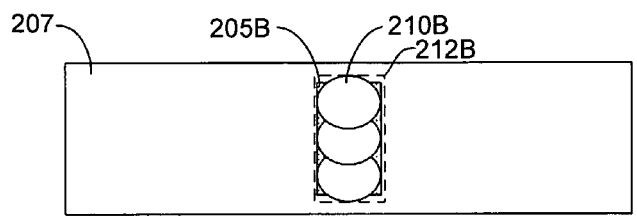
FIGS. 5(A), 5(B), 5(C), 5(D) and 5(E) are plan views depicting stages of a gap formation-type patterned structure fabrication process in accordance with another embodiment of the invention.
Figure 5B:
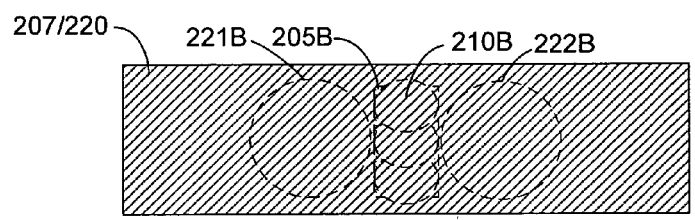
Figure 5C:
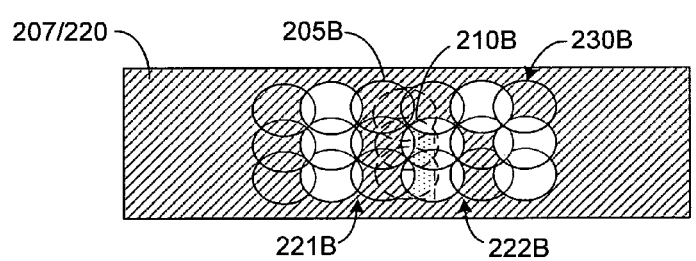
Figure 5D:
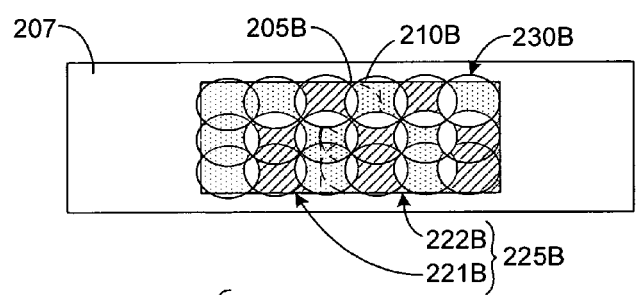
Figure 5E:
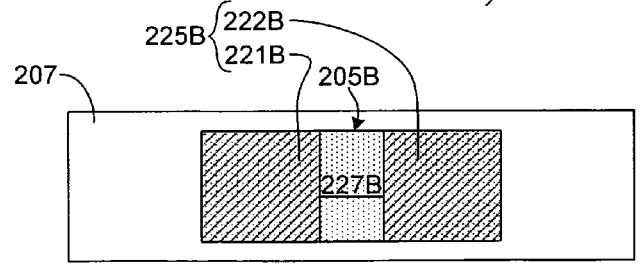
Figure 6A:
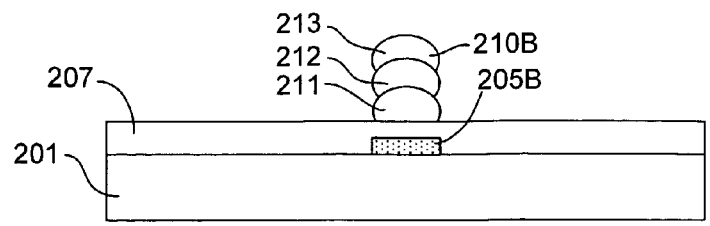
FIGS. 6(A) and 6(B) are side views depicting stages of a gap formation-type patterned structure fabrication process in accordance with another embodiment of the invention.
Figure 6B:
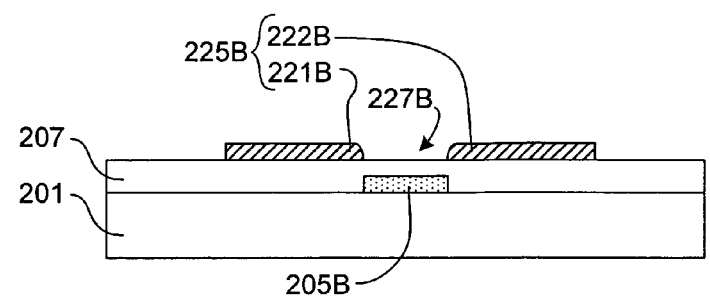

FIGS. 5(A) to 5(E) are top plan views showing the formation of a patterned structure 225B (shown in FIG. 5(E)) that defines a gap 227B separating spaced-apart portions 221B and 222B according to another specific embodiment of the present invention. Such gaps can be used, for example, to form source/drain structures of thin-film transistors (TFTs). FIGS. 5(A) to 5(E) generally correspond to the processes described above with reference to FIGS. 2A) to 2(E), respectively, and structures of 5(A) to 5(E) are identified with reference numbers that are similar to corresponding structures of FIGS. 2A) to 2(E). FIGS. 6(A) and 6(B) are side views showing selected stages of the fabrication process that are associated with FIGS. 5(A) and 5(E), respectively.

FIGS. 5(A) and 6(A) show an elongated lift-off pattern 210B that is formed on base layer 207 over a relatively narrow feature 205B such that elongated lift-off pattern 210B is aligned with feature 205B (i.e., the width of elongated lift-off pattern 210B is substantially equal to feature 205B, and the peripheral edge 212B of elongated lift-off pattern 210B (indicated by dashed line) is generally vertically aligned with a peripheral edge of feature 205B). Next, as indicated in FIG. 5(B), blanket layer 220 is formed over base layer 207, and includes portions 221B and 222B formed over corresponding regions of base layer 207 that are generally located on opposite sides of lift-off pattern 210A. FIG. 5(C) shows a printed structure mask 230B, which is then printed on blanket layer 220 such that printed structure mask 230B extends across lift-off pattern 210B such that mask 230B includes first and second portions that respectively cover first and second portions 221B and 222B of blanket layer 220, where the first and second portions of mask 230B are separated by elongated lift-off pattern 210B. FIG. 5(D) shows the structure after wet etching has removed exposed portions of the blanket layer surrounding printed mask 230B, and FIGS. 5(E) and 6(E) show patterned structure 225A after mask 230A and lift-off pattern 210A are removed, thereby exposing gap 227B between spaced-apart portions 221B and 222B. Note that opposing outside side edges of gap 227B (i.e., inside edges of first and second portions 221B and 222B) are aligned with outside edges of underlying feature 205B.

Referring again to FIG. 6(A), according to another embodiment of the invention, the printed lift-off pattern can be formed by making multiple printing passes across the same location(s) in the manner set forth in [XC-038], cited above. The resulting stacked (multilayer) pattern can then be used to create a patterned lift-off layer having beneficial masking characteristics. For example, FIG. 6(A) shows a multi-layer printed lift-off pattern 210B that is formed from printed elements 211, 212 and 213, which are successively printed at the same location during three printing passes, thereby forming the depicted stacked arrangement. The stacked arrangement increases the vertical side surface of printed lift-off pattern 210B, thereby facilitating the formation of thin or open attack points, thus aiding the lift-off process. Note that while multi-layer printed lift-off pattern 210B is described as being formed from three layers for exemplary purposes, according to various embodiments of the invention, any number of layers could be used.

Figure 7A:
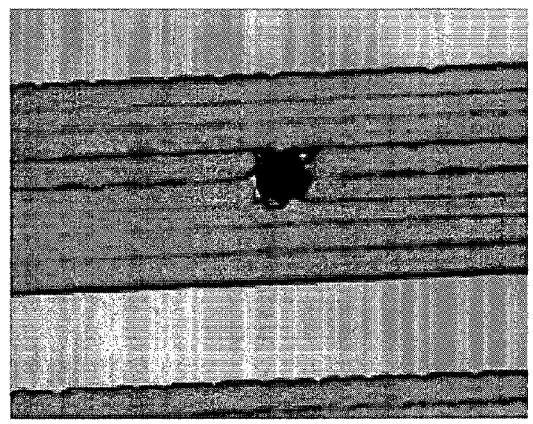
FIGS. 7(A) and 7(B) are micrographs showing raised portions of a printed mask produced by underlying lift-off patterns in accordance with an aspect of the present invention.
Figure 7B:
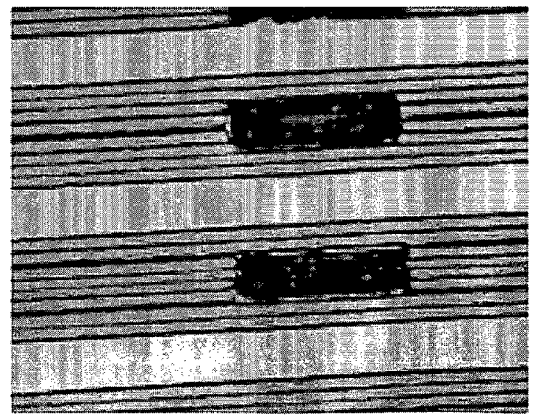

FIGS. 7(A) and 7(B) are enlarged micrographs (top view) respectively showing printed masks formed over a stacked via-type lift-off pattern (FIG. 7(A) and a stacked gap-type lift-off pattern (FIG. 7(B)). The darkened regions in the micrographs show that, although the printed mask is printed over the respective via/gap lift-off pattern, the edges of the via/gap lift-off pattern is not covered by the printed mask, thus facilitating the lift-off process described above.

The formation of patterned structures having vias and gaps using the methods described above may be used to fabricate a wide range of large area electronic structures.

For example, the via formation method can be used to fabricate solar cells having back-contact architectures where metal electrodes are patterned on the back of a substrate after cell fabrication. The resolution needed for this process is very low, typically using line widths of 200 μm. The metal electrodes are deposited on top of a $SiO_2$ passivation layer. After metal deposition and electrode patterning, a via has to be opened to connect the metal electrodes to the cell. The exemplary embodiment described above with reference to FIGS. 4(A) to 4(E) may be used to form the metal electrode with an open via. The patterned metal structure can be used as an etch mask for the $SiO_2$, enabling the cell to be connected to the outside metal grid.

Similarly, the gap formation method can be utilized in the fabrication of TFTs exhibiting minimal source/drain and gate overlap capacitance, where the channel length matches the gate electrode perfectly (e.g., as indicated in FIGS. 5(E) and 6(B), where feature 205B is the gate, and patterned structure portions 221B and 222B form the source and drain. If the printing process showed a perfect registration from layer to layer, the channel via could be printed in the exact same way as the gate layer, and the device would have no overlap capacitance. However, when the printing registration is on the order of 5 μm, this offset is enough to reduce transistor performance. One method to avoid this performance reduction is to use the same mask for gates and channel vias. However, the gate layer should be printed at higher temperatures than the channel via layer. Larger gate feature will be obtained by increasing the substrate temperature without the need of printing two pixels for the gate electrode. In this way, the channel length will be more reproducible and the overlap capacitance will be minimized.

FIGS. 8(A) to 8(L) depict another method for fabricating TFTs that utilizes back-side exposure to self-align the lift-off pattern to the gate structure, which further reduces the overlap between source/drain and gate of a TFT.

The TFT fabrication process begins by forming a gate structure, which can be formed directly on a substrate 201 or one or more underlying layers, provided the underlying layers are light transparent. First, a gate metal layer 302 is deposited over a substrate 201 (FIG. 8(A)), and then a gate mask 315 is printed onto a predetermined portion 305 of gate metal layer 302 (indicated by dashed lines in FIG. 8(B)). Gate mask 315 is used in the manner described above to mask a portion of gate metal layer 302 during wet etching, thereby removing exposed portions of the gate metal layer and producing a gate structure 205C (FIG. 8(C)). The gate mask is then removed.

Figure 8A:
FIGS. 8(A), 8(B), 8(C), 8(D), 8(E), 8(F), 8(G), 8(H), 8(I), 8(J), 8(K), and 8(L) are side views depicting stages of a TFT fabrication process in accordance with another embodiment of the invention.
Figure 8B:
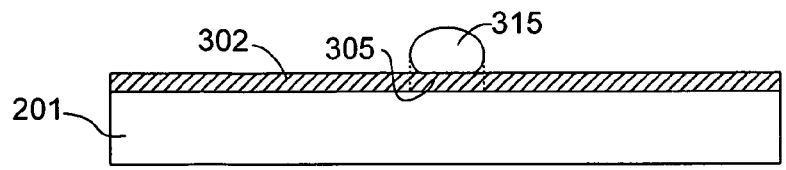
Figure 8C:
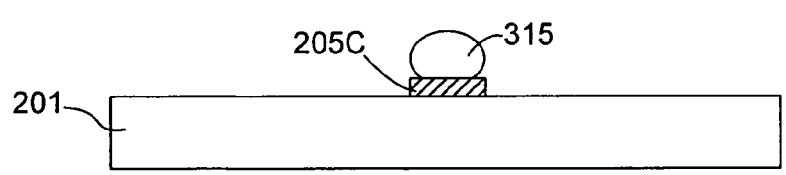
Figure 8D:
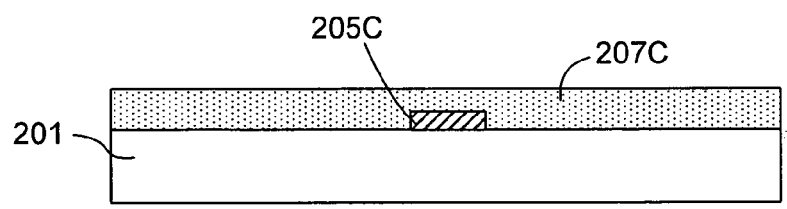
Figure 8E:
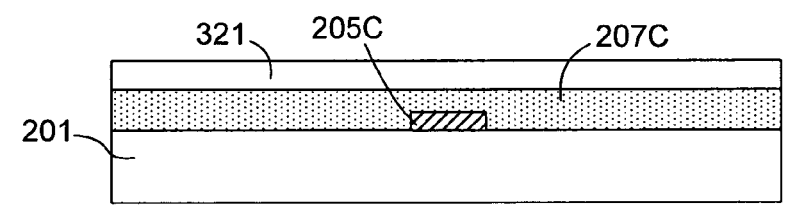
Figure 8F:
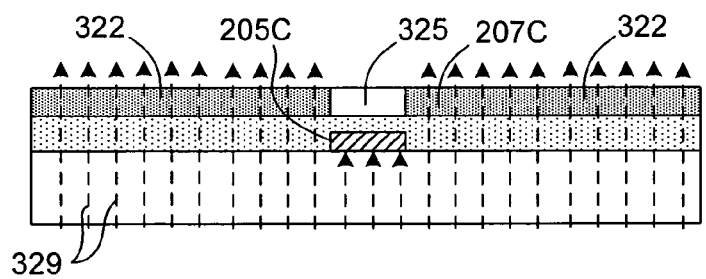
Figure 8G:
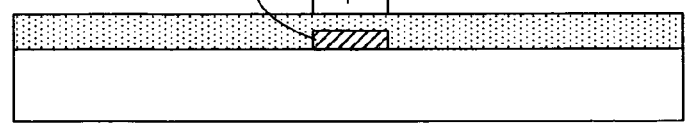

FIGS. 8(D) through 8(H) depict a process for forming a dielectric and a lift-off structure utilized by the TFT according to an aspect of the present embodiment. Referring to FIG. 8(D), a dielectric layer 207C is then formed over gate structure 205C, and then a photoresist layer 321 is formed on dielectric layer 207C (FIG. 8(E)). As indicated in FIG. 8(F), gate structure 205C is then used as a backside mask to expose portions 322 of the resist layer (i.e., such that gate structure 205C "shades" a central portion 325 from the radiant energy, which is depicted by dashed arrows 329). The exposed (second) portions 322 of the photoresist are then removed according to known techniques, whereby central photoresist portion 325 forms a lift-off pattern 210C. Using this backside exposure method, as indicated in FIG. 8(G), the side edges 212C of lift-off pattern 210C are substantially self-aligned to the corresponding side edges of gate structure 205C.

Figure 8H:
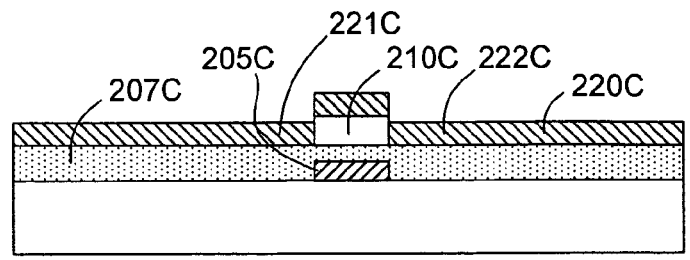
Figure 8I:
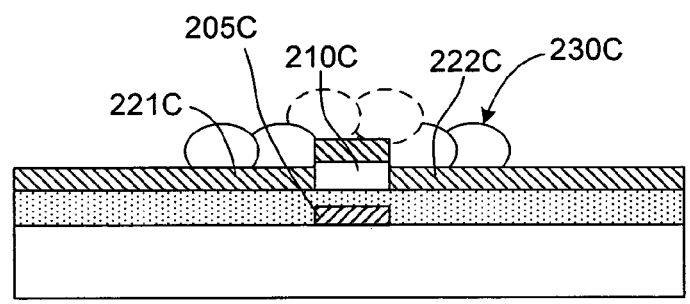
Figure 8J:
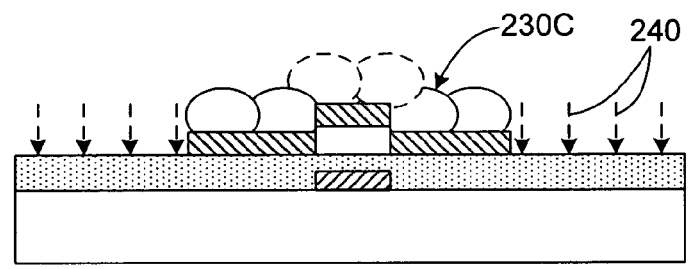
Figure 8K:
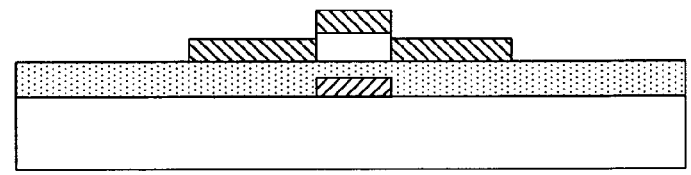
Figure 8L:
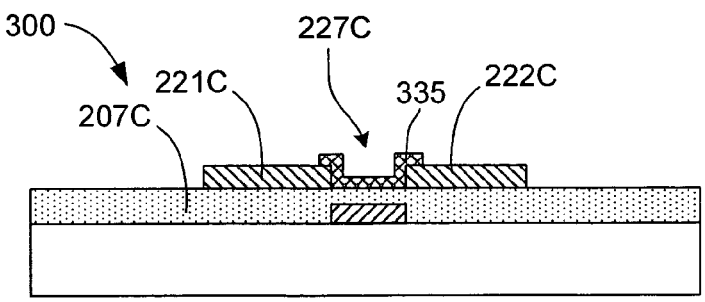

FIGS. 8(H) to 8(L) depict the formation of source/drain structures separated by a channel gap that is defined by lift-off pattern 210C using the methods described above. First, as shown in FIG. 8(H), a source/drain metal layer 220C is deposited over lift-off pattern 210C and exposed portions of dielectric layer 207C such that source/drain metal layer 220C includes a first (e.g., source) portion 221C and a second (e.g., drain) portion 222C that are respectively located on opposing sides of lift-off pattern 210C. Next, a source/drain mask 230C is printed using the techniques described above over the first and second portions 221C and 222C of source/drain metal layer 220C, and optionally overlapping lift-off pattern 210C (FIG. 8(I)). Etchant 240 is then used to remove portions of the source/drain metal layer exposed by source/drain mask 230C (FIG. 8(J)), then the source/drain mask is removed (FIG. 8(K), and finally a lift-off process is performed to remove the lift-off pattern, thereby exposing channel gap 227C between a first (e.g., source) electrode 221C and second (e.g., drain) electrode 222C, which are formed on dielectric layer 207C (FIG. 8(L)). The TFT 300 is completed by deposition and patterning of a semiconducting material island 335 over the channel region. Protective layers and contact electrodes for transmitting signals to the source/drain/gate electrodes are omitted for brevity.

Figure 9A:
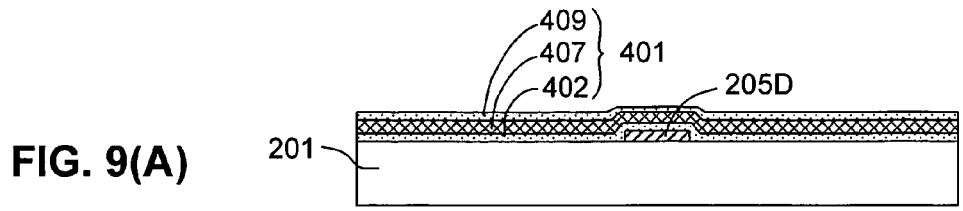
FIGS. 9(A), 9(B), 9(C), 9(D), 9(E), 9(F), 9(G), 9(H), 9(I), 9(J), 9(K), and 9(L) are side views depicting stages of a TFT fabrication process in accordance with yet another embodiment of the invention.
Figure 9B:
Figure 9C:
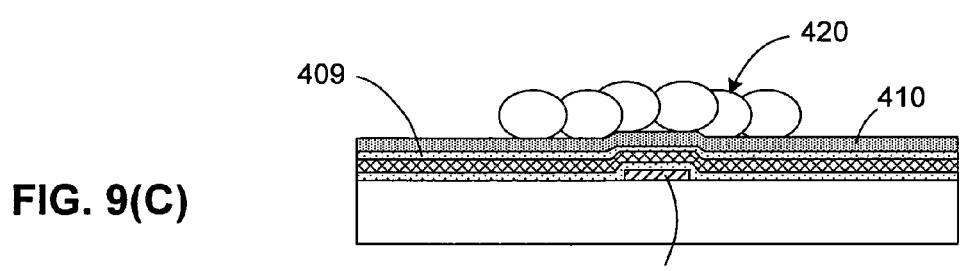
Figure 9D:
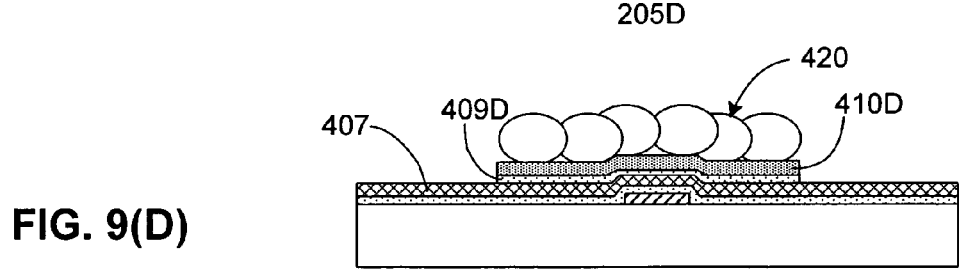
Figure 9E:
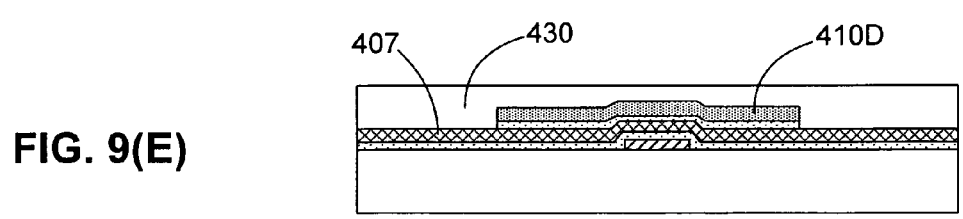
Figure 9F:
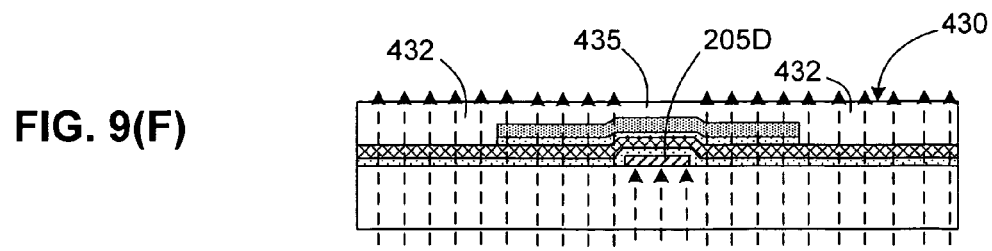
Figure 9G:
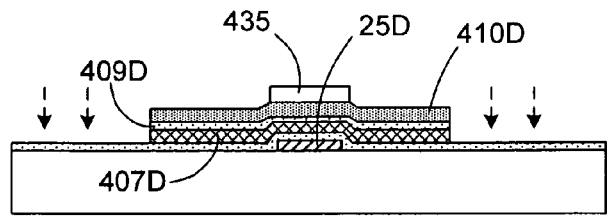
Figure 9H:
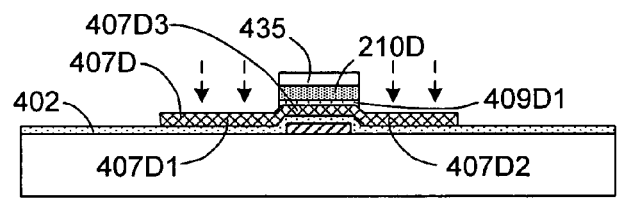
Figure 9I:
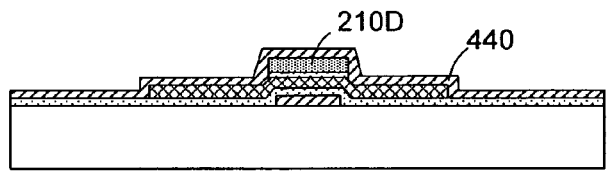
Figure 9J:
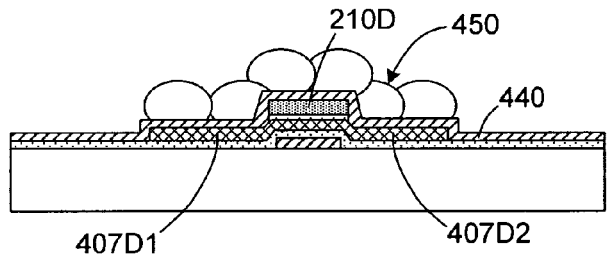
Figure 9K:
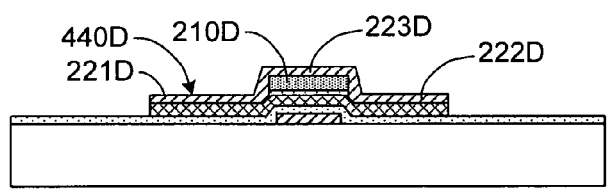
Figure 9L:
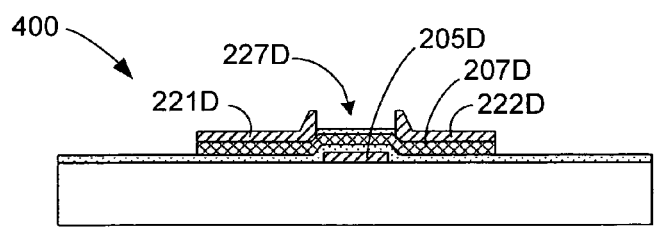

FIGS. 9(A) to 9(L) depict another method for fabricating TFTs that utilizes an amorphous silicon (a-Si:H)-based bottom gate structure. Referring to FIG. 9(A), similar to the previous process, the fabrication process begins by forming a (e.g., chromium) gate structure 205D on a substrate 201 in a manner similar to that described above. Next, as also shown in FIG. 9(A), a three-layer stack structure 401 is formed over gate structure 205D that includes an a-Si:H layer 407 sandwiched between two dielectric (e.g., $Si_3N_4$) layers 402 and 409. As shown in FIG. 9(B), a transparent sacrificial layer 410 (e.g., indium-tin oxide (ITO)) is then formed on uppermost dielectric layer 409, and FIG. 9(C) shows an island mask 420 that is printed on sacrificial layer 410 in a region overlapping gate structure 205D. FIG. 9(D) depicts the structure after the island mask 420 has been used in conjunction with a suitable etchant to remove exposed portions of the sacrificial layer and uppermost dielectric layer, thus forming a sacrificial island 410D and an underlying dielectric island 409D, and exposing peripheral portions of a-Si:H layer 407. FIG. 9(E) shows the structure after the island mask has been removed and a blanket photoresist layer 430 is formed on the upper surface of sacrificial island 410D and the exposed peripheral portions of a-Si:H layer 407. As depicted in FIG. 9(F), gate structure 205D is used as a mask to prevent exposure of a portion 435 of the photoresist layer 430 during a backside exposure of (second) portions 432 in a manner similar to that described above. FIG. 9(G) shows the structure after the exposed portions of the photoresist layer have been removed using known methods, thereby patterning resist portion 435 such that it is substantially self-aligned to the corresponding side edges of the underlying gate structure 205D. The portions of the a-Si:H layer around sacrificial island 410D are then etched, thereby forming a-Si:H island 407D. As indicated in FIG. 9(H), resist portion 435 is then used to remove the exposed portions of the sacrificial island and underlying uppermost dielectric layer, thus forming a lift-off pattern 210D on a dielectric pattern 409D1, and exposing portions 407D1 and 407D2 of a-Si:H island 407D, which are located on opposite sides of lift-off pattern 210D and are linked by portion 407D3 that extends under lift-off pattern 210D between portions 407D1 and 407D2. Referring to FIG. 9(I), the resist portion located over lift-off pattern 210D is then removed, and an n+Si layer followed by a source/drain metal layer 440 is then blanket deposited over the entire structure. Referring to FIG. 9(J), a source/drain mask 450 is then printed on metal layer 440 over a-Si:H island portions 407D1 and 407D2, and optionally over lift-off pattern 210D. The exposed portions of metal layer 450 are then etched, and then mask 450 is removed, producing the structure shown in FIG. 9(K), which includes a metal island 440D including a first (e.g., source) portion 221D and a second (e.g., drain) portion 222D that are respectively located on opposing sides of lift-off pattern 210D, and connected by a third portion 223D. Finally, a lift-off process is performed to remove the lift-off pattern in the manner described above, thereby exposing a channel gap 227D between a first (e.g., source) electrode 221D and second (e.g., drain) electrode 222D, which are formed on dielectric layer 207D (FIG. 9(L)), essentially completing the fabrication of a TFT 400 (protective layers and contact electrodes for transmitting signals to the source/drain/gate electrodes are omitted for brevity).

Figure 10A:
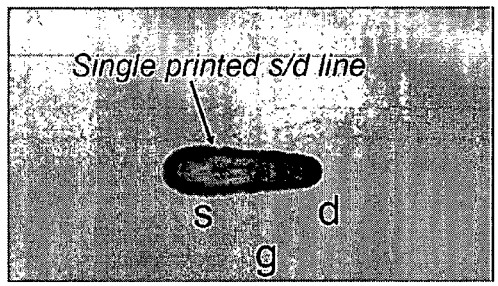
FIGS. 10(A) and 10(B) are micrographs showing TFT structures at selected stages of the process depicted in FIGS. 9(A) to 9(L).
Figure 10B:

FIGS. 10(A) and 10(B) are micrographs illustrating TFTs formed substantially in accordance with the method described above with reference to FIGS. 9(A) to 9(L). FIG. 10(A) shows the pattern of the s/d contact prior to lift off to the sacrificial layer. In contrast to the standard patterning required for defining a s/d (source/drain) contact using printed etch masks, the self aligned etch mask is a single printed line that crosses over the channel region above the gate electrode. The s/d metal is then etched to define the s/d regions relative to the gate (g) electrode. After etching the s/d metal the sacrificial layer is removed to lift off the region over the gate electrode and define the channel region. FIG. 10(B) shows the resulting structure after lift-off. The resulting TFTs were found to exhibit operating characteristics that were comparable to TFTs produced by standard fabrication methods. Accordingly, the embodiment described with reference to FIGS. 9(A) to 9(L) provide a method in which channel gap 227D is self-aligned to gate 205D, thus enabling the production of high quality TFTs for large area electronic devices without requiring the use of lithographic masks.

Although the present invention has been described in connection with several embodiments, it is understood that this invention is not limited to the embodiments disclosed, but is capable of various modifications that would be apparent to one of ordinary skill in the art. Therefore, the invention is limited only by the following claims.

The invention claimed is:

1. A method for fabricating a patterned layer structure on a substrate such that the patterned layer structure includes first and second layer portions separated by a void, the method comprising:

forming a lift-off pattern over the substrate by depositing a printing fluid onto a base layer such that the printing fluid attaches itself to the base layer through a wetting action, whereby the printing fluid solidifies to form said lift-off pattern such that the lift-off pattern has a rounded cross-sectional profile;

forming a blanket layer over the substrate such that first and second portions of the blanket layer are located on opposite sides of the lift-off pattern, a third portion located over the liftoff pattern, and attack point portions respectively extending between the third portion and the first and second portions, wherein the blanket layer is formed such that the attack point portions are thinner than the first, second and third portions;

depositing a source/drain metal layer over the liftoff pattern such that the source/drain metal layer includes first and second portions respectively located on opposing sides of the liftoff pattern;

patterning a mask over the first and second portions of the blanket layer such that the patterned mask extends over the lift-off pattern;

removing portions of the blanket layer exposed around the patterned mask, and the patterned mask and the lift-off pattern.

2. The method of claim 1, wherein forming the patterned mask over the first and second portions of the blanket layer comprises jet printing.

3. The method of claim 1, wherein forming the lift-off pattern comprises jet printing a phase change material.

4. The method of claim 1, wherein patterning the mask comprises printing a phase change material using a printing system.

5. The method of claim 4, wherein printing the mask further comprises printing the phase change material in multiple passes such that a plurality of printed elements are printed in a stacked arrangement.

6. The method of claim 1, wherein removing the exposed blanket layer portions, the patterned mask, and the lift-off pattern comprises:
applying an etchant to the exposed blanket layer portions, and
applying a solvent to the patterned mask and the lift-off pattern.

7. The method of claim 1, wherein removing the lift-off pattern further comprises at least one of applying sonication to the lift-off pattern and heating the lift-off pattern.

8. The method of claim 1,
wherein forming the lift-off pattern comprises forming a dot-like lift-off pattern,
wherein patterning the mask comprises forming said patterned mask such that an outer peripheral edge of the patterned mask surrounds the dot-like lift-off pattern, and
wherein removing the exposed blanket layer portions, the patterned mask, and the lift-off pattern comprises etching said exposed blanket layer portions to form an island-like patterned structure defining a via located between the first and second portions, wherein the via occupies a space created by removal of said dot-like lift-off pattern.

9. The method of claim 1,
wherein forming the lift-off pattern comprises forming an elongated lift-off pattern,
wherein patterning the mask comprises forming said patterned mask such that the elongated lift-off pattern extends between the first and second portions of the blanket layer, and
wherein removing the exposed blanket layer portions, the patterned, and the lift-off pattern comprises etching said exposed blanket layer portions such that a gap is defined between the first and second portions, wherein the gap occupies a space created by removal of said elongated lift-off pattern.

10. The method of claim 1,
wherein forming the lift-off pattern comprises forming said lift-off pattern such that the lift-off pattern is aligned with an underlying feature, and
wherein patterning the mask comprises forming said patterned mask such that the first and second portions of the blanket layer covered by said patterned mask are separated by the lift-off pattern, and
wherein removing the exposed blanket layer portions, the patterned mask, and the lift-off pattern comprises etching said exposed blanket layer portions such that a gap is defined between the first and second portions, wherein opposing edges of the gap are aligned with opposing edges of the underlying feature.

11. The method of claim 10, wherein forming the lift-off pattern comprises printing a phase change material using a printing system.

12. A method for fabricating a thin-film transistor, the method comprising:
forming a gate structure over a substrate;
forming a liftoff pattern over the gate structure by depositing a printing fluid onto a base layer such that the printing fluid attaches itself to the base layer through a wetting action, whereby the printing fluid solidifies to form said lift-off pattern such that the lift-off pattern has a rounded cross-sectional profile;
depositing a source/drain metal layer over the liftoff pattern such that the source/drain metal layer includes first and second portions respectively located on opposing sides of the liftoff pattern, a third portion located over the liftoff pattern, and attack point portions respectively extending between the third portion and the first and second portions, wherein the source/drain metal layer is formed such that a thickness of each attack point portion is thinner than thicknesses of the first, second and third portions;
printing a source/drain mask over the first and second portions of the source/drain metal layer such that the printed mask extends over the lift-off pattern; and
removing portions of the source/drain metal layer exposed around the printed source/drain mask, the printed source/drain mask, and the liftoff pattern.

13. The method of claim 12, wherein forming the liftoff pattern comprises jet printing a phase change material.

14. The method of claim 12, wherein printing the mask comprises printing a phase change material using a printing system.

15. The method of claim 14, wherein printing the mask further comprises printing the phase change material in multiple passes such that a plurality of printed elements are printed in a stacked arrangement.

16. The method of claim 12, wherein removing the exposed source/drain metal layer portions, the print mask, and the liftoff pattern comprises:
applying an etchant to the exposed source/drain layer portions, and
applying a solvent to the print mask and the liftoff pattern.

17. The method of claim 12, wherein removing the liftoff pattern further comprises at least one of applying sonication to the liftoff pattern and heating the liftoff pattern.

* * * * *

UNITED STATES PATENT AND TRADEMARK OFFICE
CERTIFICATE OF CORRECTION

PATENT NO. : 7,459,400 B2
APPLICATION NO. : 11/184304
DATED : December 2, 2008
INVENTOR(S) : Ana C. Arias et al.

It is certified that error appears in the above-identified patent and that said Letters Patent is hereby corrected as shown below:

In the Specification:

Column 1, line 5, please delete "70NANBOH3033" and insert --70NANB0H3033--.

Signed and Sealed this
Tenth Day of September, 2013

Teresa Stanek Rea
*Acting Director of the United States Patent and Trademark Office*